United States Patent [19]

Jun

[11] Patent Number: 5,409,856

[45] Date of Patent: Apr. 25, 1995

[54] PROCESS OF MAKING A CAPACITOR IN A SEMICONDUCTOR MEMORY DEVICE

[75] Inventor: Young-Kwon Jun, Seoul, Rep. of Korea

[73] Assignee: Goldstar Electron Co., Ltd., Chungcheongbuk-do, Rep. of Korea

[21] Appl. No.: 131,219

[22] Filed: Oct. 6, 1993

[30] Foreign Application Priority Data

Oct. 7, 1992 [KR] Rep. of Korea ................ 92-18293

[51] Int. Cl.⁶ ...................... H01L 21/70; H01L 27/00
[52] U.S. Cl. ........................................ 437/52; 60/919
[58] Field of Search ............................ 437/47–48, 437/52, 60, 919; 257/303, 306, 308

[56] References Cited

U.S. PATENT DOCUMENTS 5,170,233  12/1992  Liu ............................ 437/52
5,240,871  8/1993  Doan et al. ................. 437/52

OTHER PUBLICATIONS

"3-Dimensional Stacked Capacitor Cell For 16M and 64M Drams", T. Ema et al., IEDM, 88:592–595 (1988).

Primary Examiner—Olik Chaudhuri
Assistant Examiner—H. Jey Tsai
Attorney, Agent, or Firm—Finnegan, Henderson, Farabow, Garrett & Dunner

[57] ABSTRACT

A process of making a capacitor in a semiconductor memory device provides photomasking processes which are reduced as all the stacked-disposable layers and the storage electrode node contact are patterned at the same time, and also an efficient area of the storage electrode node of a capacitor is maximized, and the process is simplified due to the formation of indented (fin-shaped) area by eliminating selectively the disposable layers which is stacked more than two time.

The present invention provides a simple and time-saving process of making a capacitor in a semiconductor memory cell device.

18 Claims, 3 Drawing Sheets

PROCESS OF MAKING A CAPACITOR IN A SEMICONDUCTOR MEMORY DEVICE

FIELD OF THE INVENTION

The present invention relates to a process of making a capacitor in a semiconductor memory device, particularly fabricating a fin-shaped storage electrode node of a storage capacitor cell in a semiconductor memory device, which meet the demands for simplifying processes and enhancing memory integration for semiconductor devices.

BACKGROUND OF THE INVENTION

It is conventional to fabricate a fin-shaped storage electrode node of a capacitor used in a semiconductor memory device.

This conventional technology for making a fin-shaped capacitor is shown in FIG. 1 with cross sectional views, and comprises the steps of:

in FIG. 1(A), defining isolation areas and active areas on a silicon substrate, depositing gate oxide (21) and polysilicon on them, forming a gate by patterning the gate oxide (21) and polysilicon, completing a MOS transistor by forming source/drain regions (11), and depositing a silicon nitride layer (22) layer, in FIG. 1(B), depositing a silicon oxide layer (23), a polysilicon layer (24) and silicon oxide layer (25) in cited order, forming a contact hold (30) to make a storage electrode node contact;

in FIG. 1(C), depositing a polysilicon (26) layer, forming a photoresist pattern (not shown), patterning a storage electrode node by means of etching anisotropically polysilicon layers (24,26) and silicon oxide layers (23,25) with the photoresist pattern;

in FIG. 1(D), forming a fin-shaped storage electrode node (8) by a wet etching of silicon oxide which has remained in a storage electrode node pattern; and in FIG. 1(E), forming a dielectric layer (27) on a storage electrode node, fabricating a capacitor in the memory cell by forming a plate electrode (10) through depositing polysilicon on a dielectric layer, depositing a silicon oxide layer (28), forming a contact hole, completing a memory cell after the formation of a bit line (18).

In this conventional process, one of the main problems is that more polysilicon-interlayer layers are needed to increase the number of fins of a storage electrode node in order to attain an ultra integrated circuit, resulting in processes and process time which are more complicated and prolonged.

SUMMARY OF THE INVENTION

Being intended to overcome the above described disadvantages of the conventional arts, the present invention has as an object of providing a simple and time-saving process of making a capacitor in a semiconductor memory cell device.

In achieving the above object, the present invention of a process of making a capacitor in a semiconductor memory cell device comprises the steps of: (1), forming required circuit elements on a semiconductor substrate, depositing an insulation layer, forming a first disposable layer (equivalent to "interlayer" in a different expression) of material 1 on the insulation layer, a second disposable layer of material 2, a third disposable layer of material 1 and a fourth disposable layer of material 2, where material 1 and 2 have different etching rates; (2), forming a contact hole by etching the disposable layers of material 1 and material 2, and the insulation layer; (3), depositing a first conductive layer and a fifth disposable layer of material 2; (4), defining a storage electrode node region pattern of a capacitor by etching all of the first, second, third and fourth disposable layers; the first conductive layer and the fifth disposable layer; (5), removing the remaining disposable layers of material 1 by wet etching; (6), depositing a second conductive layer, etching anisotropically the second conductive layer to form a storage electrode node region; and (7), forming a storage electrode node by a wet etching of all the remaining disposable layers made of material 2.

In order to complete a capacitor, the process further comprises the steps of: forming a dielectric layer on the storage electrode node; and forming a plate electrode on the dielectric layer.

The present invention is described in a different expression, using another terminology, as follows, to make it clear.

In a different expression of the present invention, a process of making a capacitor in a semiconductor memory device, comprising the steps of: (a), forming a plurality of isolation regions and active regions on a semiconductor substrate, depositing a first insulation layer on the semiconductor substrate, forming a plurality of gate lines on the first insulation layer, forming a plurality of first impurity regions and second impurity remains between said gate lines in the semiconductor substrate, forming a second insulation layer on the gate lines and the semiconductor substrate, forming a plurality of alternate first interlayers of a first material and second interlayers of a second material difference from the first material on the second insulation layer; (b), forming a plurality of contact holes on a plurality of the first impurity regions by means of eliminating a plurality of first and second interlayers and the second insulation layer; (c), forming the first conductive layer on both the surface of a last-formed second kind interlayer and the regions of a plurality of the contact holes, forming a third interlayer on the first conductive layer; (d), defining a plurality of storage electrode node patterns from regions of the first and second interlayers, the first conductive layer, and the third interlayer; (e), eliminating all remaining regions of the first interlayers; (f), forming a second conductive layer all over the semiconductor substrate; (g), removing all of the second conductive layer except for portions inside of the plurality of the storage electrode node patterns; (h), forming a plurality of storage electrode nodes by eliminating all of the remaining areas of the interlayers and a third interlayer; (i) and (j), forming a dielectric layer on a plurality of the storage electrode nodes, forming a plurality of plate electrodes on the dielectric layer.

BRIEF DESCRIPTION OF THE DRAWINGS

The above object and other advantages of the present invention will be more apparent by describing in detail the preferred embodiment of the present invention with reference to the attached drawings, wherein.

DESCRIPTION OF THE PREFERRED EMBODIMENT

FIGS. 2(A) to 2(E) illustrate a process of making a capacitor in a semiconductor memory device according to the present invention.

Figure 1A:
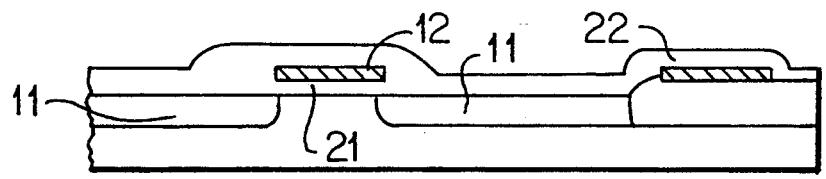
FIGS. 1(A) to 1(E) are cross sectional views for explaining the process of making a capacitor in a semiconductor memory device for the art and FIGS. 2(A) to 2(I) are cross sectional views for explaining the process of making a capacitor in a semiconductor memory device according to the present invention.
Figure 1B:
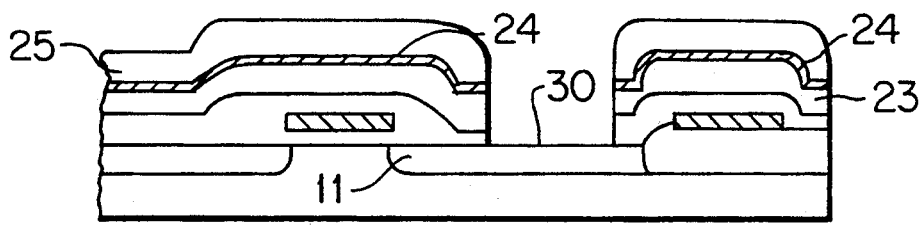
Figure 1C:
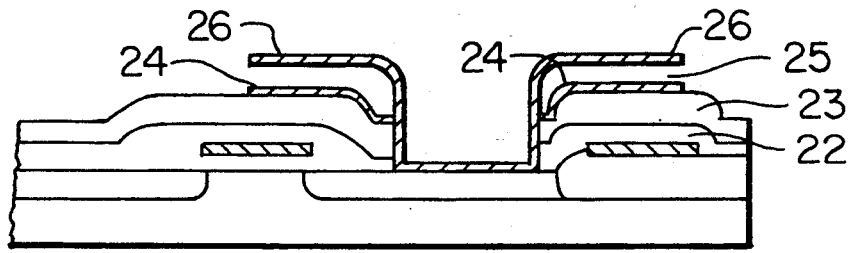
Figure 1D:
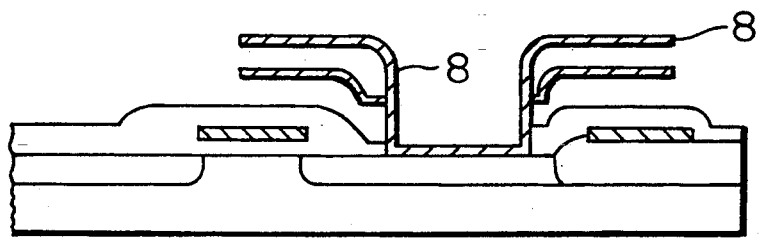
Figure 1E:
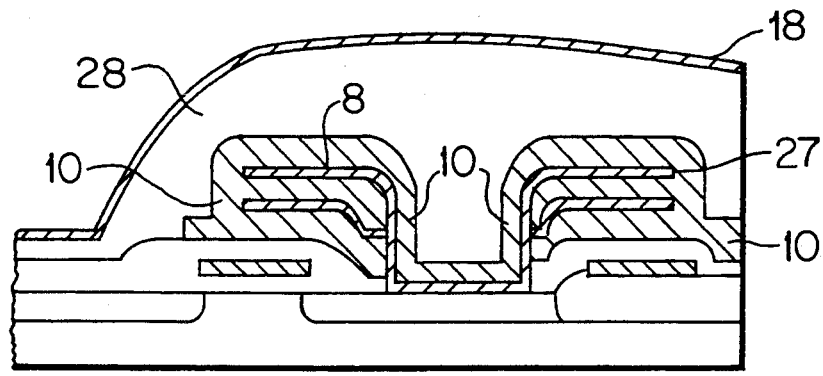
Figure 2C:
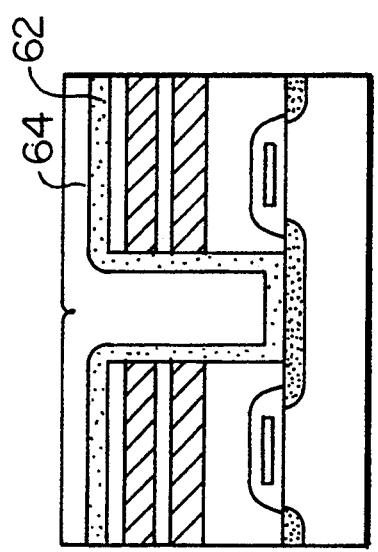
Figure 2B:
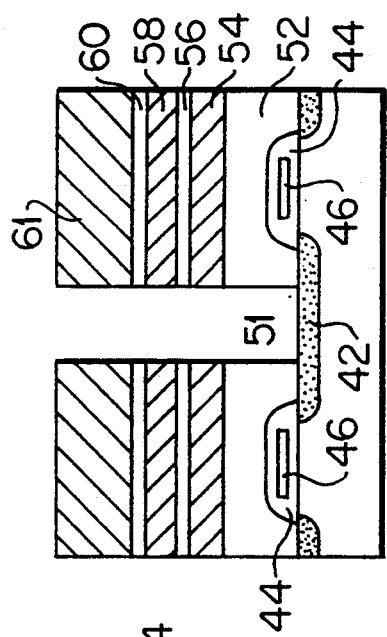
Figure 2A:
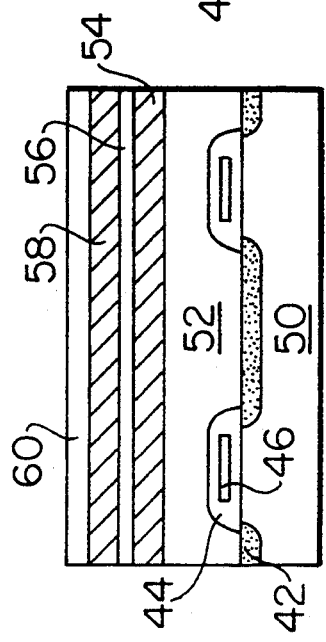

As shown in FIG. 2A, after forming active, field areas and required circuit elements on a semiconductor substrate (50), source/drain regions and a gate electrode (46) are formed which are surrounded by a gate insulation layer (44). An insulation layer (52) is deposited on a wafer. The first disposable layer (54) which is made of material 1 (silicon nitride) is deposited by LPCVD (low pressure chemical vapor deposition) or PECVD (plasma enhanced chemical vapor deposition) to the thickness of 500–1000 Å on the insulation layer (52). A second disposable layer (56) made of material 2(polyimide) is deposited on the first disposable layer (54) by a Spin Coat method to the thickness of 200–500 Å. A third disposable layer (58) of material l(silicon nitride) is deposited by LPCVD or PECVD to the thickness of 500–1000 Å on the second disposable layer (56). A fourth disposable layer (60) of material 2(polyimide) is deposited on the third disposable layer (58) by SOG to the thickness of 200–500 Å.

These disposable layers (54, 56, 58, 60) remain only during the process. Material 1 and material 2 vary greatly in etching rates from each other and also they have a great difference in selective etching ratio against silicon layers (amorphous silicon or polysilicon) and a silicon oxide layer.

Subsequently larger capacitance can be obtained by stacking double layers of material 1 and material 2 two or more times.

As shown in FIG. 2B, a contact hole (51) for a storage electrode node contact to the source/drain region (42) is formed by etching anisotropically the first (54), second (56), third (58), and fourth (60) disposable layers and the silicon oxide layer (52) after defining a photoresist pattern (61).

As shown in FIG. 2C, after the photoresist pattern (61), is removed polysilicon forming a first conductive layer (62) is deposited to the thickness of 200–2000 Å by LPCVD at about 560° to 620° C., using SiH4 or a mixture of Si2H4 and PH3 as a source gas.

Next, polyamide (material 2) of a fifth disposable layer (64) is coated on the first conductive layer (62) by Spin Coat method to the thickness of 500–1000 Å at about 400° to 600° C.

Material 2 of the fifth disposable is more efficient than material 1 (silicon nitride) for subsequent etching processes of the second, fourth and fifth disposable layers although the materials could be switched.

Figure 2E:
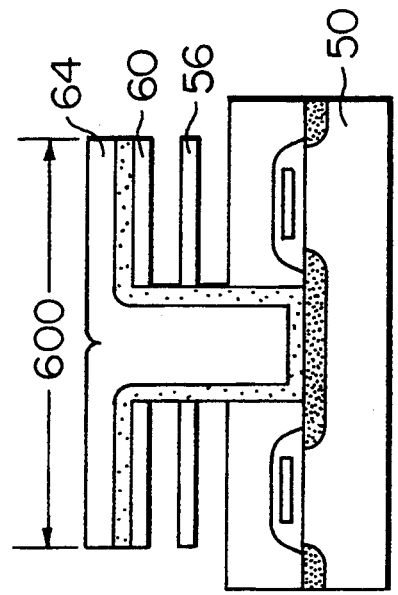
Figure 2D:
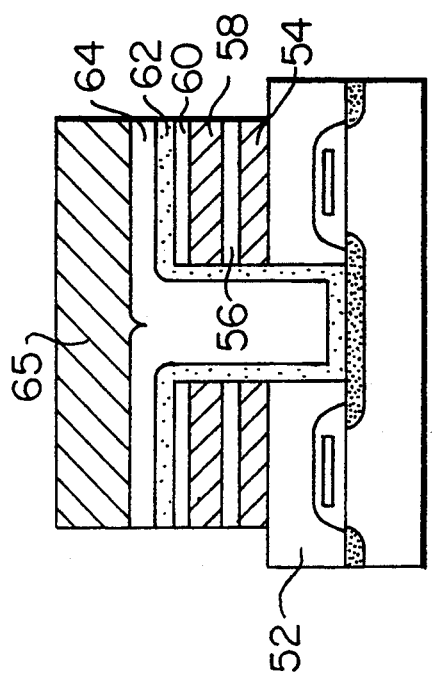

As shown in FIG. 2D, a photoresist pattern (65) is applied to the fifth disposable layer (64) for the purpose of defining a storage electrode node pattern of the capacitor. The storage electrode node pattern (600) is defined by etching anisotropically the fifth disposable layer (64), the first conductive layer (62), the fourth (60), third (58), and second (56), first (54) disposable layers simultaneously, wherein the insulation layer (52) of silicon oxide is used as an etching-stop layer.

As shown in FIG. 2E, after the photoresist pattern (65) is removed, the first (54) and second (58) disposable layers are removed by wet etching in an H3PO4 solution.

Figure 2F:
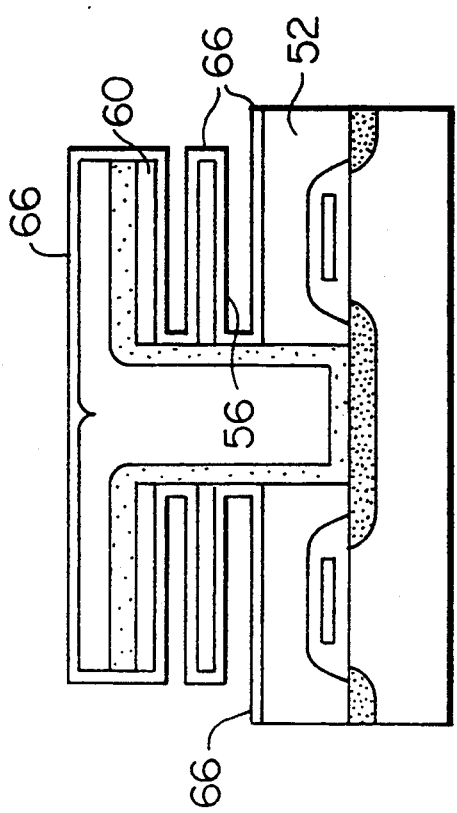

As shown in FIG. 2F, polysilicon of the second conductive layer (66) is deposited by LPCVD to the thickness of 200–2000 Å at about 560°–620° C. on both the storage electrode node pattern (600) and the insulation layers (52).

Figure 2G:
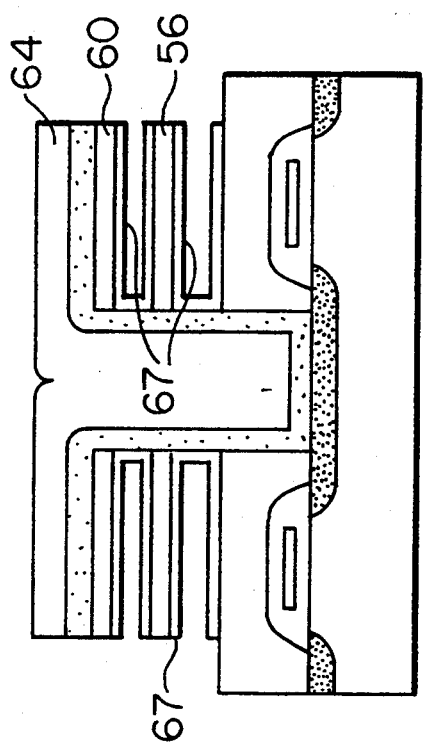

As shown in FIG. 2G, areas of the second conductive layer (66) remain after anisotropical etching and a surface of the fifth disposable layer (64) is exposed.

Figure 2H:
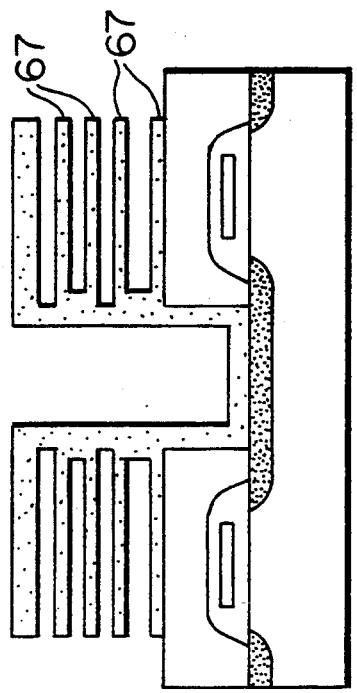

As shown in FIG. 2H, the second (56), fourth (60) and fifth (64) disposable layers are removed by wet etching in an H2SO4 solution, resulting in a completed frame of a storage electrode node.

Figure 2I:
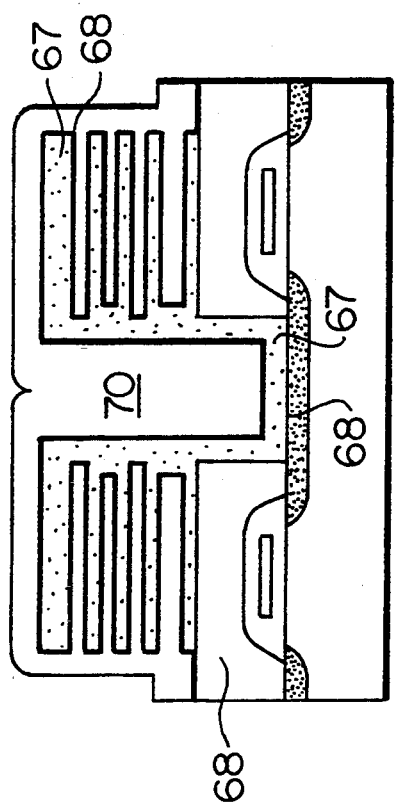

As shown in FIG. 2I, a dielectric layer (68) is formed on the completed frame of the storage electrode node. The dielectric may be formed as a double layer consisting of silicon nitride and silicon oxide. Polysilicon is deposited on the dielectric layer (68) by LPCVD to the thickness of about 2000 Å and patterned to form a plate electrode (70) to complete the capacitor.

The present invention as described above provides various advantages: photomasking processes are reduced as all the stacked-disposable layers and the storage electrode node contacts are patterned at the same time; and an efficient area of the storage electrode node of a capacitor is maximized and the process is simplified due to the formation of indented (fin-shaped) areas by eliminating selectively the disposable layers which are stacked more than two times.

What is claimed is:

1. A process of making a capacitor in a semiconductor memory device, comprising the steps of:
    (a) forming a memory cell transistor on a semiconductor substrate, depositing an insulation layer, forming a plurality of double layers, each of the plurality of double layers including a first disposable layer of a first material and a second disposable layer of a second material different from the first material;
    (b) forming a contact hole by etching the first and the second disposable layers and the insulation layer;
    (c) depositing a first conductive layer and a last disposable layer of the second material on the first conductive layer;
    (d) defining a storage electrode node region pattern of a capacitor by etching the plurality of double layers of the first and second disposable layers, the first conductive layers, and the last disposable layer;
    (e) eliminating the first disposable layers of the first material by means of wet etching;
    (f) depositing a second conductive layer, etching anisotropically the second conductive layer to form a storage electrode node region;
    (g) forming a storage electrode node in the storage electrode node region by wet etching of each of the disposable layers made of the second material;
    (h) forming a dielectric layer on the storage electrode node; and
    (i) forming a plate electrode on the dielectric layer.

2. The process as in claim 1, wherein the first material and the second material have different etching rates.

3. The process as in claim 1, wherein the first material is silicon nitride and the second material is polyimide.

4. The process as in claim 1, wherein the first material is polyimide and the second material is silicon nitride.

5. The process as in claim 1, wherein the steps of forming the first and the second conductive layers comprise forming the first and the conductive layers of polycrystalline silicon.

6. The process as in claim 1, wherein
the step (a) includes the steps of depositing the first disposable layer to a thickness of 500–1000 Å, and the second disposable layer to a thickness of 500–1000 Å,
the step (c) includes the steps of forming the first conductive layer to a thickness of 200–1000 Å at about 560° to 620° C., and the last disposable layer to a thickness of 500–1000 Å at about 400° to 600° C. on the first conductive layer,
the step (f) includes the steps of forming the second conductive layer to a thickness of 200–2000 Å at about 560° to 620° C.

7. The process as in claim 6, wherein;
the step (c) includes forming the first conductive layer by means of LPCVD to a thickness of 200–2000 Å, at a temperature between 560°–620° C. in a source gas of $SiH_4$ or a mixture of gases of $Si_2H_4$ and $PH_3$;
the step (e) includes the step of removing the disposable layers of the first material by wet etching in $H_3PO_4$ solutions; and
the step (f) includes removing the disposable layers of the second material by wet etching in $H_2SO_4$ solutions.

8. The process as in claim 2, wherein the step of forming the dielectric layer consists of forming a silicon nitride-silicon oxide double layer.

9. The process as in claim 1, wherein the step of forming a plurality of double layers includes forming a first double layer including a first disposable layer of the first material and a second disposable layer of the second material and a second double layer including a first disposable layer of the first material and a second disposable layer of the second material.

10. The process as in claim 1, wherein the step of forming a memory cell transistor on a semiconductor substrate includes providing a semiconductor substrate that is a P-type.

11. The process as in claim 1, wherein the step of forming a memory cell transistor on a semiconductor substrate includes providing a semiconductor substrate that is an N-type.

12. A process of making a capacitor in a semiconductor memory device, comprising the steps of:
(a) forming a plurality of isolation regions and active regions on a semiconductive substrate, depositing a first insulation layer on the semiconductor substrate, forming a plurality of gate lines on the first insulation layer, forming a plurality of first impurity regions and second impurity regions in order between the gate lines in the semiconductor substrate, forming a second insulation layer on the gate lines and the semiconductor substrate, forming a plurality of disposable double layers on the insulation layer, each of the double layers including a first disposable layer of a first material and a second disposable layer of a second material;
(b) forming a plurality of contact holes on a plurality of the first impurity regions by selectively eliminating a plurality of regions of the first disposable layers, the second disposable layers, and the second insulation layer;
(c) forming a first conductive layer on both the surface of the last-formed second disposable layer and the plurality of contact holes, and forming a third disposable layer of the first material on the first conductive layer;
(d) defining a plurality of storage electrode node patterns including areas of the plurality of the first disposable layers, the second disposable layers, the first conductive layer, and the third disposable layer;
(e) removing all of the remaining areas of the first disposable layers;
(f) forming a second conductive layer over the semiconductor substrate;
(g) removing all of the second conductive layer except for portions of the second conductive layer inside of the plurality of the storage electrode node patterns;
(h) forming a plurality of storage electrode nodes by removing all remaining areas of the second disposable layers and the third disposable layer; and
(i) forming a dielectric layer on the storage electrode nodes, and a plate electrode on the dielectric layer.

13. The process as in claim 12, wherein the first disposable layers and the third disposable layer are made of the same material.

14. The process as in claim 12, wherein the step of forming the first disposable layers includes forming the first disposable layers from silicon nitride and the step of forming the second disposable layers comprises forming the second disposable layers of polyimide.

15. The process as in claim 14, wherein the step of forming the first disposable layers comprises forming the first disposable layers of polyimide and the step of forming the second disposable layers comprises forming the second disposable layers of silicon nitride.

16. The process as in claim 12, wherein the steps of forming the first and second insulation layers comprise forming the first and second insulation layers of silicon oxide.

17. The process as in claim 12, wherein the steps of forming the first and second conductive layers comprise forming the first and second conductive layers of polycrystalline silicon.

18. The process as in claim 12, wherein the step of removing the second conductive layer is performed by means of etching anisotropically.

* * * * *